(12) United States Patent
Carluccio et al.

(10) Patent No.: US 11,777,204 B2
(45) Date of Patent: Oct. 3, 2023

(54) PACKAGE

(71) Applicant: NXP B.V., Eindhoven (NL)

(72) Inventors: Giorgio Carluccio, Eindhoven (NL); Michael B. Vincent, Chandler, AZ (US); Maristella Spella, Eindhoven (NL); Antonius Johannes Matheus de Graauw, Haelen (NL); Harshitha Thippur Shivamurthy, Eindhoven (NL)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 17/453,199

(22) Filed: Nov. 2, 2021

(65) Prior Publication Data

US 2022/0231408 A1     Jul. 21, 2022

(30) Foreign Application Priority Data

Jan. 15, 2021   (EP) .................................. 21151906

(51) Int. Cl.
*H01Q 1/22*   (2006.01)
*H01Q 1/46*   (2006.01)

(52) U.S. Cl.
CPC ............. *H01Q 1/46* (2013.01); *H01Q 1/2283* (2013.01)

(58) Field of Classification Search
CPC ................................. H01Q 1/46; H01Q 1/2283
USPC ....................................................... 343/700 R
See application file for complete search history.

(56) References Cited

U.S. PATENT DOCUMENTS

| | | | |
|---|---|---|---|
| 9,136,230 B2 | 9/2015 | Demin et al. | |
| 9,435,842 B2 | 9/2016 | Vaucher et al. | |
| 9,583,811 B2 | 2/2017 | Seler et al. | |
| 9,917,372 B2 | 3/2018 | Tong et al. | |
| 10,164,318 B2 | 12/2018 | Seok et al. | |
| 10,522,895 B2 | 12/2019 | Blech et al. | |
| 10,692,824 B2 | 6/2020 | Lachner et al. | |
| 2015/0229017 A1 | 8/2015 | Suzuki et al. | |
| 2015/0364830 A1 | 12/2015 | Tong et al. | |
| 2019/0115643 A1 | 4/2019 | Khan et al. | |
| 2020/0296823 A1* | 9/2020 | Kamgaing | H05K 1/0243 |
| 2020/0365535 A1 | 11/2020 | De Graauw et al. | |
| 2022/0209779 A1* | 6/2022 | Herbsommer | G06F 1/14 |

* cited by examiner

*Primary Examiner* — Peguy Jean Pierre

(57) ABSTRACT

A package includes an integrated circuit, IC, die having circuitry configured to generate signalling for transmission to a waveguide and/or receive signalling from a waveguide via a launcher. The die is coupled to an interconnect layer extending out from a footprint of the die. The launcher is formed in a launcher-substrate, separate from the die. The launcher is coupled to the die to pass the signalling therebetween by a connection in the interconnect layer. The launcher includes a launcher element mounted in a first plane within the launcher-substrate and a waveguide-cavity including a ground plane arranged opposed to and spaced from the first plane. The waveguide-cavity is further defined by at least one side wall extending from the ground plane towards the first plane. The die and launcher are at least partially surrounded by mould material of the package.

20 Claims, 8 Drawing Sheets

PACKAGE

CROSS-REFERENCE TO RELATED APPLICATIONS

This application claims the priority under 35 U.S.C. § 119 of European Patent application no. 21151906.1, filed on 15 Jan. 2021, the contents of which are incorporated by reference herein.

FIELD

The present disclosure relates to a package and, in particular, a package including an integrated circuit die and a launcher formed in a launcher-substrate, separate from the integrated circuit die. It also relates to an electronic device comprising said package.

BACKGROUND

Current methods of transmitting and receiving an RF signal from and to a semiconductor die involve passing it between the die within a package through a low loss printed circuit board (PCB) and a launcher mounted on the PCB and having a waveguide (WG) with an antenna mounted thereover. Other examples place the launcher into a package together with the die.

SUMMARY

According to a first aspect of the present disclosure there is provided a package comprising, an integrated circuit (IC) die comprising circuitry configured to generate signalling for transmission to a waveguide and/or receive signalling from a waveguide via a launcher, the die coupled to an interconnect layer extending out from a footprint of the die; and the launcher is formed in a launcher-substrate, separate from the die, the launcher coupled to the die to pass said signalling therebetween by a connection in said interconnect layer, wherein said launcher comprises a launcher element mounted in a first plane within the launcher-substrate and a waveguide-cavity comprising a ground plane arranged opposed to and spaced from the first plane, the waveguide-cavity further defined by at least one side wall extending from the ground plane towards the first plane; and wherein said die and said launcher are at least partially surrounded by mould material of said package.

In one or more examples a plurality of launchers are provided in respective launcher-substrates within said package.

In one or more examples the package includes a plurality of IC dies within said package. In one or more examples the package includes a plurality of launcher-substrates within said package.

In one or more embodiments said package comprises one of: a fan-out-wafer-level-package (FO-WLP) wherein said interconnect layer comprises a redistribution layer of said die; and a flip-chip-chip-scale-package (FC-CSP), wherein said interconnect layer comprises a flip-chip-substrate of said flip-chip-chip-scale-package.

In one or more embodiments said ground plane of the waveguide-cavity is arranged adjacent to the interconnect layer and the launcher element is spaced further from the interconnect layer than the ground plane, wherein said launcher element is coupled to said connection in the interconnect layer by vias that extend through an aperture formed in said ground plane.

In one or more embodiments said ground plane of the waveguide-cavity is arranged adjacent to the interconnect layer and the launcher element is spaced further from the interconnect layer than the ground plane, wherein said launcher element is coupled to said connection in the interconnect layer by vias that extend through the launcher-substrate and through a slot in the at least one side wall.

In one or more embodiments said launcher element of the waveguide-cavity is arranged adjacent to the interconnect layer and the ground plane is spaced further from the interconnect layer than the launcher element, wherein said launcher element is coupled to said connection in the interconnect layer by one or more vias that extend through said launcher-substrate.

In one or more embodiments the launcher element is connected to said one or more vias through a slot formed in said at least one side wall.

In one or more embodiments the said one or more vias extend from the interconnect layer at a location within a footprint of the waveguide-cavity.

In one or more embodiments said launcher element comprises a loop and said connection between the launcher and the die comprises a differential microstrip line.

In one or more embodiments said waveguide-cavity comprises: the ground plane of said waveguide-cavity comprising a metallization layer in said launcher-substrate, and a plurality of vias extending from, and electrically connected to, said ground plane metallization layer that are arranged in a ring to form said at least one side wall, the said plurality of vias, at a point opposite their coupling to the metallization layer, coupled together by a ring-shaped second metallization layer.

In one or more examples, the ring-shaped second metallization layer is in the first plane with the launcher element.

In one or more embodiments said launcher-substrate includes a substrate-cavity having a base opposite the launcher element and side walls, the substrate-cavity defining the waveguide-cavity wherein the ground plane comprises a metallization layer at the base of the substrate-cavity in the launcher-substrate, and the side walls comprise a further metallization layer over the side walls of the cavity.

In one or more embodiments the launcher-substrate comprises at least one of: PTFE; a Bismaleimide-Triazine; a Borosilicate glass; and fused Quartz.

In one or more embodiments the first plane in which the launcher element is formed is located adjacent a side of the launcher-substrate wherein, one of: said side is covered with said mould material and has an electrically conductive interface layer arranged in a ring on said mould material that is aligned with said waveguide-cavity and is configured to receive said waveguide, wherein at least said mould material on said side that is inward of a footprint of said side walls is left uncovered by said electrically conductive interface layer; and said side is covered with mould material and has a further dielectric material layer and the waveguide is configured to abut said dielectric material layer; and said side of the substrate is uncovered and has periodic structures around the footprint of said side walls.

In one or more embodiments the package is in combination with a waveguide, wherein the first plane in which the launcher element is formed is located adjacent a side of the launcher-substrate and said waveguide is arranged to couple to said side.

In one or more examples the package of the integrated circuit (IC) die may be covered by a thermal interface material (TIM).

In one or more embodiments the package is in combination with a waveguide, wherein the waveguide has an entirely open cross section at the interface between the waveguide and the package.

According to a second aspect of the present disclosure there is provided an electronic device comprising one of a telecommunication radio interface and a radar system, such as an automotive radar system, including the package.

Thus, in an (e.g. automotive) radar system, the package may be configured to transmit the radar signals to a waveguide and/or receive the reflected radar signals. In a telecommunication radio interface, the package may be configured to send and/or receive signals to enable communication between a mobile telephone and a base station.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Many devices require the use of a transmitter, receiver or transceiver circuit coupled to an antenna or antenna arrays. An example of a system that uses transmitter/receiver/transceiver circuits is an advanced driver assistance systems (ADAS) or autonomous driving (AD) radar systems. Such transmitter/receiver/transceiver circuits are also used in telecommunications.

Providing an effective way to couple a transmitter/receiver/transceiver circuit to a waveguide is important. Typically, waveguides are assembled over the top of the antenna launchers, which are positioned on the PCB adjacent to the package containing the transmitter/receiver/transceiver circuit.

The example embodiments disclosed herein provide one or more examples in which transmitter, receiver or transceiver circuitry is mounted into a single package along with a corresponding launcher for coupling electromagnetic (EM) signalling (e.g. a signal or signals) to and/or from a waveguide. Such an arrangement is referred to as a launcher-in-package arrangement. Such an arrangement can provide for a number of advantages such as reducing the overall footprint required on the PCB as well as reducing the insertion losses from the package to the antenna and vice versa. Furthermore, this approach relaxes the requirements for the PCB on which the package is mounted allowing for more efficient use of materials. This is achieved by eliminating the need for routing of signalling such as mm-Wave signals between the IC die and the antenna launchers along the PCB itself. This may more cost effective.

The example embodiments disclosed herein may enable effective use of the substrate materials because the materials used in the die that contains the aforementioned circuitry and the mould material of the package can be different to the materials in which the launcher is formed.

Figure 1:
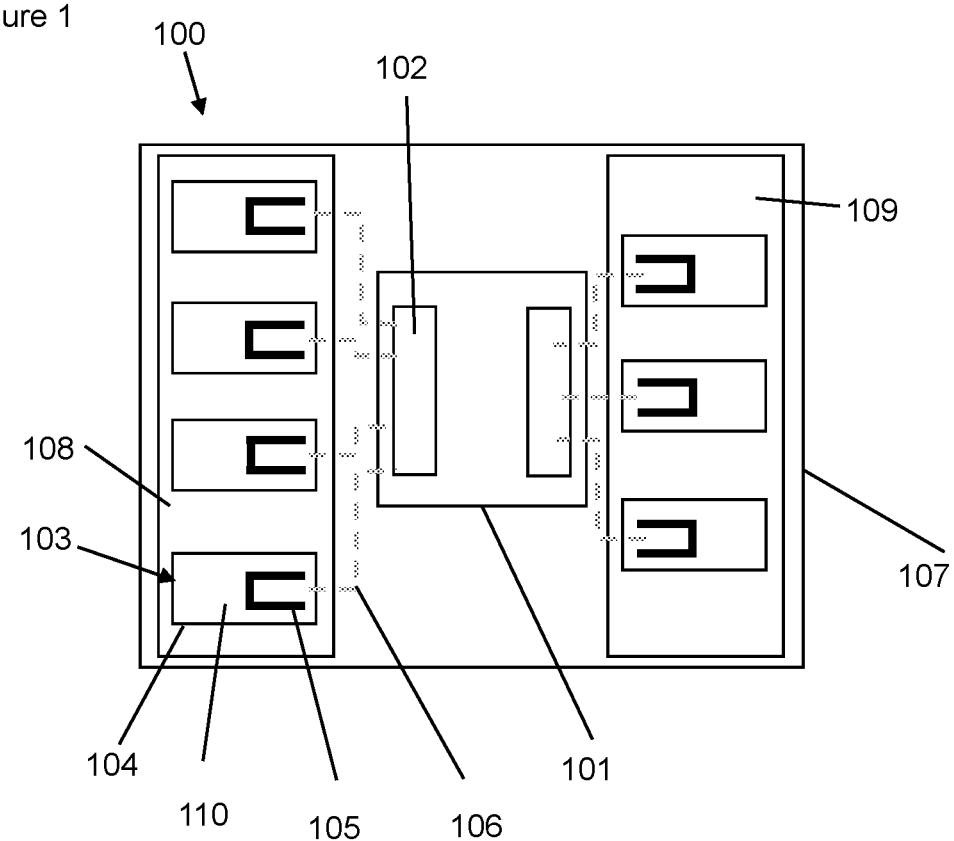
FIG. 1 shows a plan view of an example embodiment of a package comprising an integrated circuit (IC) die and a launcher with a waveguide-cavity formed within a separate launcher substrate which are all partially surrounded by mould material of said package.
Figure 2:
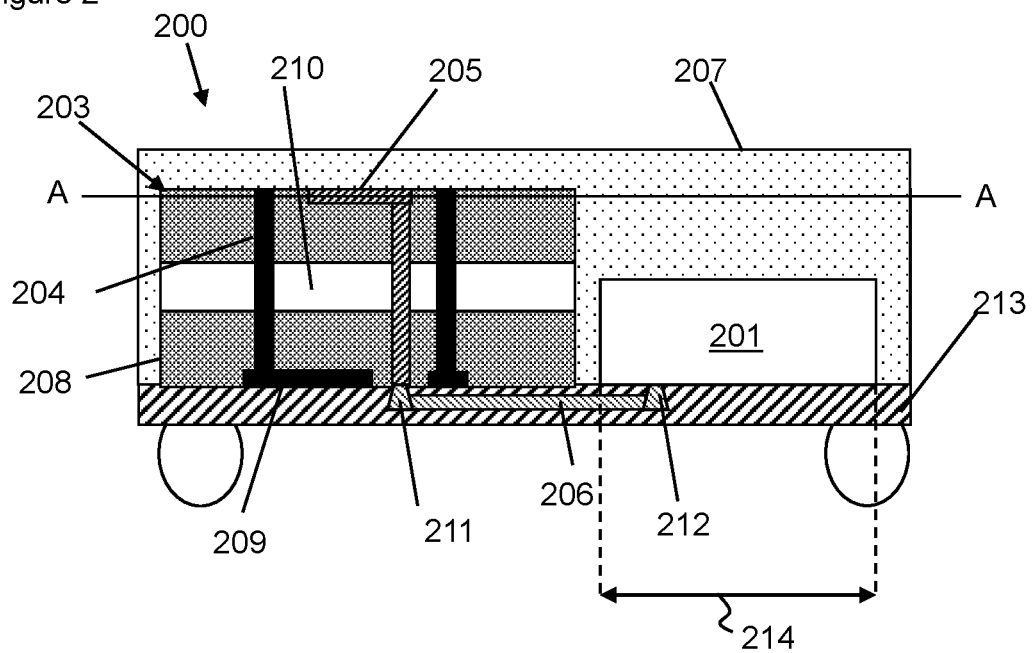
FIG. 2 shows a cross sectional side view of an example embodiment of the package.

Example FIGS. 1 and 2 show a package 100 comprising an integrated circuit (IC) die 101, 201, a launcher 103, 203, and waveguide-cavity 110, 210 formed within a separate launcher substrate 108, 208, which are all partially surrounded by mould material 107, 207 of said package. It will be appreciated that in some embodiments such as a FC-CSP embodiment, the mould material may be an underfill material.

FIG. 1 shows an example embodiment in which a plurality of launchers 103 are provided in a first common launcher substrate 108 and a plurality of launchers 103 are provided in a second common launcher substrate 109. Each launcher 103 comprises a launcher element 105, forming an antenna of the launcher, and a waveguide-cavity 110. FIG. 2 shows a cross sectional view showing a single IC die 201, and a single launcher substrate 208, for simplicity. In this example and the example figures that follow, a single IC die 201 and a single launcher substrate 208 is shown. However, it will be appreciated that the IC die 201, may be configured to couple to one or more launchers 203. Thus, there may be one or more IC dies connected to one or more launchers forming a multi-chip-module (MCM) arrangement/package. In examples where there are a plurality of launchers, those launchers may be formed in a single launcher substrate 208, or a plurality of launcher substrates.

The IC die 101 comprises circuitry 102, configured to generate signalling for transmission to a waveguide and/or receive signalling from a waveguide via the launcher 103. In one or more examples the circuitry comprises a transmitter circuit for generation of electrical signalling that is for transmission by said launcher 103. In one or more examples the circuitry comprises a receiver circuit for receiving signalling from a remote device, said signalling received by the launcher 103. In one or more examples the circuitry may comprise a transceiver circuit configured for one or both of transmitting signalling from and receiving electrical signalling to the IC 101 via the launcher 103.

Returning to FIG. 2, the IC die 201 is coupled to an interconnect layer 213, extending out from a footprint 214 of the die. In one or more examples the footprint 214 of the IC die 201 is defined as the area directly below the spatial extent of the IC die 201. Thus, the IC die may comprise a top and bottom surface connected by sidewalls and the interconnect layer 213 may extend from a point on one of said top and bottom surfaces in a direction substantially parallel to said one of the top and bottom surface and beyond the location of the sidewalls. In one or more examples, the interconnect layer 213 is a layer having a metallic connection or trace 206 configured to provide a conductive path between an electrical terminal 212 of the circuitry of the IC die 201 and an electrical terminal 211 of the launcher 203.

The launcher 203 is formed in a separate launcher-substrate 208, separate from the IC die 201. The launcher-substrate 208 is positioned adjacent to and external to the footprint 214 of the IC die 201.

By way of the launcher-substrate 208 being separate from the IC die 201, different materials for the launcher-substrate 208 can be used. The more effective use of materials may reduce manufacturing complexity. For example, the launcher-substrate 208, may be of a higher quality material for reasons of launcher performance without requiring the use of the same material for the substrate of the entire package 200 or the mould material 207.

In one or more examples, the launcher-substrate 208 is formed of materials that are less lossy at a given frequency than the material that forms the IC die 201 and the rest of the package 200.

The launcher 203 is coupled to the IC die 201 to pass said signalling therebetween by a connection 206 in said interconnect layer 213. The launcher 203 comprises a launcher element 205 mounted in a first plane A-A within the launcher-substrate 208. Thus, the launcher element 205 comprises an antenna which transmits the signalling received from the IC die 201 to the waveguide or receives EM signalling from the waveguide and provides it to the IC die 201, via the connection 206.

The waveguide-cavity 210 comprises a ground plane 209 arranged opposed to and spaced from the first plane A-A. The ground plane may comprise a layer of metallization which acts as a reflector in the launcher 203. In one or more examples the ground plane 209 and the first plane A-A, in which the launcher element 205 lies, may be parallel to one another and spaced apart. In one or more examples, the ground plane and the first plane A-A (or equally the launcher element 205) may be located at opposite sides of the substrate 208.

The waveguide-cavity 210 is further defined by at least one side wall 204, extending from the ground plane 209 towards the first plane A-A. In the example of FIG. 1 and FIG. 2, the waveguide-cavity 210 is an open-sided cuboid and therefore there are four side walls 204.

Thus, in one or more examples, the waveguide-cavity 210, with the launcher element 205, is configured to define a cavity for efficient coupling of the signalling to the waveguide. The spacing between the launcher element 205 and the ground plane 209 may be selected based on the frequency of the signalling to be transmitted or received.

The IC die 201 and launcher 203 are at least partially surrounded by mould material 207 of said package 200. In one or more examples, mould material 207 is configured to encapsulate or partially encapsulate the launcher-substrate 208 and the IC die 201 to fix their relative positions within the package 200. In one or more examples, mould material is configured to provide insulation between various components 201, 203 within the package 200.

Thus, in use, the launcher element 105, 205 coupled to transmit circuitry via the interconnect layer 213 is configured to receive electrical signalling output from the transmit circuitry of the IC die 201 and to transmit this electrical signalling as electromagnetic (EM) radiation from the launcher 203. Thus, in one or more examples, the launcher element 205 is configured to couple electromagnetic radiation to free space. In one or more examples the launcher element is configured to couple electromagnetic radiation to a separate waveguide coupled to or spaced apart from the package 200 and positioned over the launcher 203.

In one or more examples the launcher 203, when coupled to receive circuitry via the interconnect layer 213, is configured to send electrical signalling generated from electromagnetic radiation received by the launcher 203 to the receive circuitry of the IC die 201. In one or more examples the launcher is coupled either directly to free space or to a waveguide that is directly coupled to or spaced apart from the package 200 and positioned over the launcher 203.

In one or more examples the launcher 203, when coupled to transceiver circuitry via the interconnect layer 213, is configured to both receive electrical signalling output from the transceiver circuitry of the IC die 201 and to transmit electrical signalling as electromagnetic radiation from the launcher 203, and is also configured to send electrical signalling generated from electromagnetic radiation received by the launcher 203 to the transceiver circuitry of the IC die 201.

In one or more examples, the launcher element 205 comprises one of a differential feed antenna or a single feed antenna. Accordingly, the connection 206 may comprise a single trace or a pair of traces to carry the signalling between the IC die 201 and the launcher element 205 of the launcher 203. In one or more examples, the launcher element 205 is formed within the upper-most metallic layer of the launcher-substrate 208. In one or more examples the launcher element is formed within any metallic layer of the launcher-substrate 208.

As described above, in relation to FIG. 1, the launcher-substrate 208 may comprise a plurality of launchers. In one or more examples the plurality of launchers and launcher elements thereof may consist of a mixture of transmit launcher elements, receive launcher elements or transceiver launcher elements or may all be of a single type.

In one or more examples the plurality of launchers 103 and launcher elements 105 can be driven by independently controlled circuitry within the IC die 101 or by multiple physically separated ICs embedded within a common package. Thus, the plurality of launchers 103 may be able to act as a beam forming network. They may also operate to form a multiple-input-multiple-output (MIMO) antenna array, multiple-input-single-output (MISO) antenna array, a single-input-multiple-output (SIMO) antenna array or a single-input-single-output (SISO) antenna array.

Figure 3:
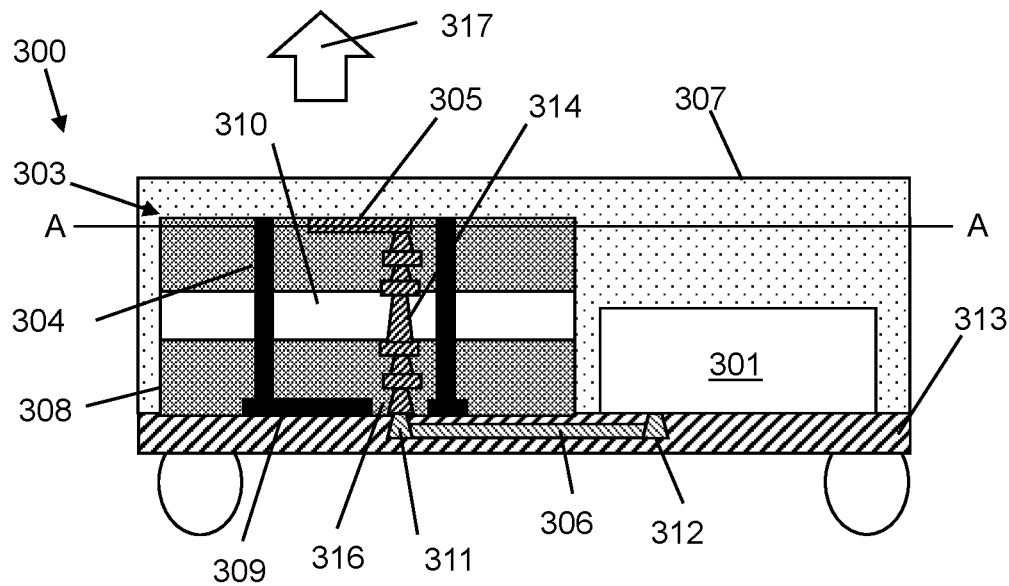
FIG. 3 shows a cross sectional side view of an example embodiment of a package wherein a launcher element is connected to an interconnect layer through an aperture in a ground plane and spaced from the interconnect layer at a "top side" of the launcher.

FIG. 3 shows a cross sectional view of a package 300, comprising a fan-out-wafer-level-package (FO-WLP) arrangement. The same reference numerals as in FIG. 2 have been used for like parts but with the series increased to 3xx rather than 2xx. In this example, the interconnect layer is embodied as a redistribution layer (RDL) 313 of the IC die 301. In this and one or more other examples the ground plane 309 of the waveguide-cavity 310 is arranged adjacent to the interconnect layer 313, and the launcher element 305 is spaced further from the interconnect layer 313 than the ground plane 309. The arrangement shown in FIG. 3 provides for EM radiation that is substantially directed away from the ground plane 309 out through an open side of the waveguide cavity at which the launcher element 305 is located. The emission of EM radiation is in a substantially upward direction as shown by arrow 317 and provides for the reception of EM radiation in a substantially downward direction.

In this and one or more examples, the launcher element 305 is coupled to said connection 306, in the interconnect layer 313, by the terminal 311 (which bridges the border between the RDL 313 and the launcher-substrate 308 and by one or more vias 314. The terminal 311 may itself comprise a via. The one or more vias 314 may extend through an aperture 316 formed in said ground plane 309.

Figure 4:
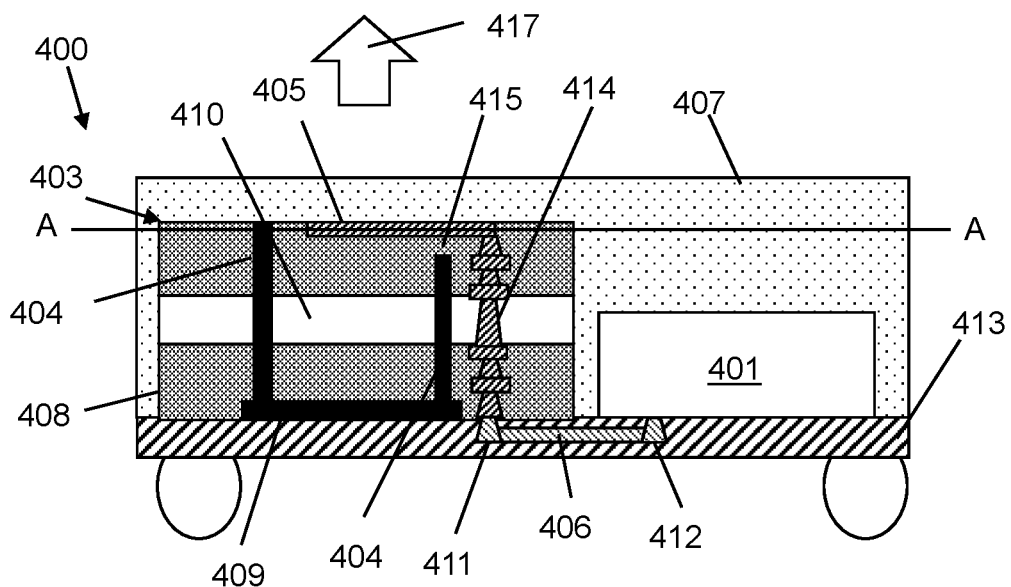
FIG. 4 shows a cross sectional side view of an example embodiment of a package wherein the launcher element is connected to an interconnect layer through a slot in a side wall of a waveguide-cavity and spaced from the interconnect layer at a "top side" of the launcher.

FIG. 4 shows a cross sectional view of a package 400 comprising a fan-out-wafer-level-package (FO-WLP) arrangement. The interconnect layer 413 is, in this example, embodied as a redistribution layer (RDL) of the IC die 401. In this example, the ground plane 409 of the waveguide-cavity 410 is arranged adjacent to the interconnect layer 413. The launcher element 405 is spaced further from the interconnect layer 413 than the ground plane 409. The arrangement shown in FIG. 4 provides for the emission of EM radiation that is substantially directed away from the ground plane 409 and is in a substantially upward direction as shown by arrow 417 and provides for the reception of EM radiation in a substantially downward direction.

The example of FIG. 4 differs from that of FIG. 3, primarily in that the launcher element 405 is coupled to said connection 406 in the interconnect layer 413 by one or more vias 414 that extend through the launcher-substrate 408 and through a slot 415, in the at least one side wall 404. Thus, the one or more vias 314, 414 that couple the launcher element 305, 405 to the connection 306, 406 may be within (FIG. 3) or outside (FIG. 4) the waveguide cavity 310, 410, but within the launcher-substrate 308, 408. The one or more vias 314 may extend through an aperture 316 in the ground plane 309 or the one or more vias 414 may extend to the first plane A-A and the launcher element 405 or an extension thereof through the slot 415 in the at least one side wall 404.

Figure 5:
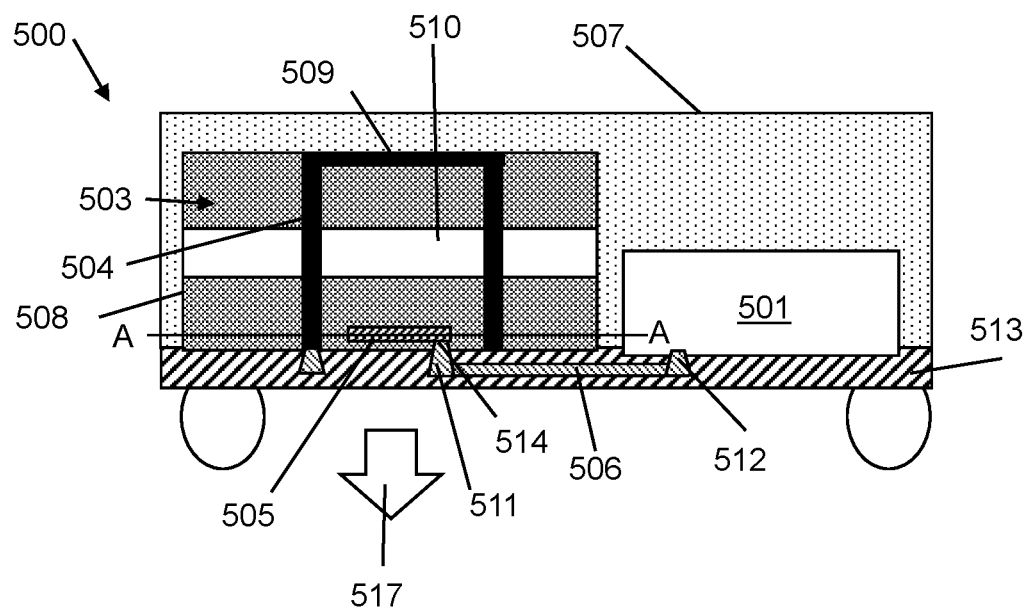
FIG. 5 shows a cross sectional side view of an example embodiment of a package wherein the launcher element is connected to an interconnect layer within the footprint of the waveguide-cavity and wherein the launcher is closer to the interconnect layer than the ground plane and adjacent to the interconnect layer at a "bottom side" of the launcher.

FIG. 5 shows a cross sectional view of a further example package 500, comprising a fan-out-wafer-level-package (FO-WLP) arrangement. The interconnect layer 513 is provided by a redistribution layer (RDL) of the IC die 501. In this and one or more other examples, the launcher element 505, of the waveguide-cavity 510, is arranged adjacent to the interconnect layer 513, and the ground plane 509, is spaced further from the interconnect layer 513, than the launcher element 505. Thus, the first plane A-A is located adjacent to the RDL 513. In one or more examples the arrangement shown in FIG. 5 provides for the emission EM radiation that is substantially directed away from the ground plane 509 and out of an open side (i.e. a non-metallized side) of the waveguide-cavity 510, and is in a substantially downward direction as shown by arrow 517 and provides for the reception of EM radiation in a substantially upward direction.

In one or more examples, the launcher element 505, is coupled to the connection 506, in the interconnect layer 513, by one or more vias 514, which may include the terminal 511, and that extend into and through said launcher-substrate 508.

In one or more examples, the one or more vias 514 extend from the interconnect layer 513, at a location within a footprint of the waveguide-cavity 510, as shown in example FIG. 5. Example FIG. 6 shows a different arrangement of the one or more vias.

Figure 6:
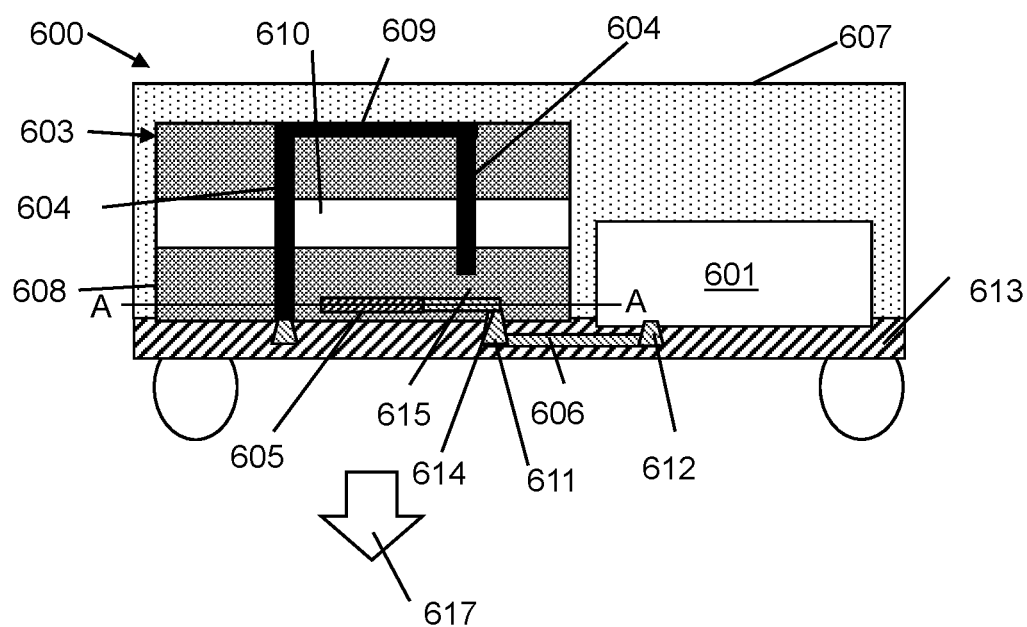
FIG. 6 shows a cross sectional side view of an example embodiment of a package wherein the launcher element is connected to an interconnect layer through a slot in a side wall of the waveguide-cavity and wherein the launcher is closer to the interconnect layer than the ground plane and adjacent to the interconnect layer at a "bottom side" of the launcher.

FIG. 6 shows a cross sectional view of a package 600, comprising a fan-out-wafer-level-package (FO-WLP) arrangement. The interconnect layer 613 is provided by a redistribution layer (RDL) of the IC die 601. In this example, similar to the example of FIG. 5, the launcher element 605 of the waveguide-cavity 610 is arranged adjacent to the interconnect layer 613, and the ground plane 609 is spaced further from the interconnect layer 613 than the launcher element 605. Thus, the first plane A-A is located adjacent to the RDL 613. The arrangement shown in FIG. 6 provides for the emission of EM radiation that is substantially directed away from the ground plane 609 and out of an open side of the waveguide-cavity 610 (i.e. a non-metallized side) and is in a substantially downward direction as shown by arrow 617 and provides for the reception of EM radiation in a substantially upward direction.

In one or more examples, the launcher element 605 is coupled to the connection 606 in the interconnect layer 613, by one or more vias 614 which may include the terminal 611, and that extend into and through said launcher-substrate 608.

In the example of FIG. 6, the launcher element 605, is connected to the one or more vias 614, through a slot 615, formed in said at least one side wall 604.

Figure 7:
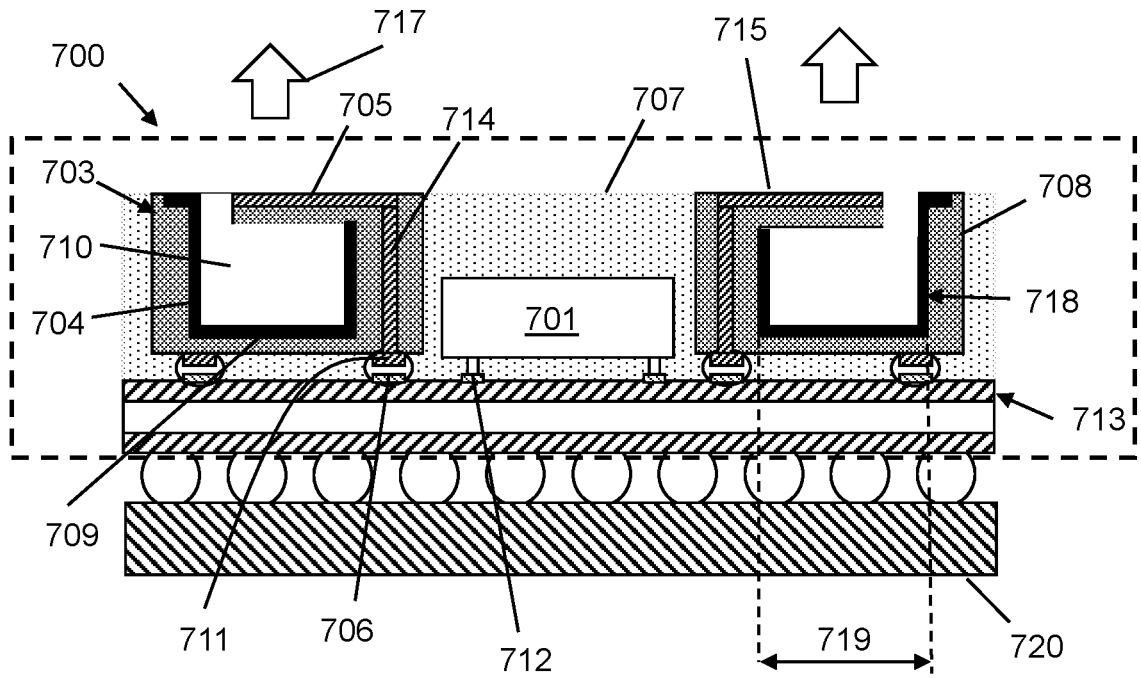
FIG. 7 shows a cross sectional side view of an example embodiment of a package wherein the package comprises a flip-chip chip scale package (FC-CSP)

FIG. 7 shows a cross sectional view of a further example package 700, comprising a flip-chip-chip-scale-package (FC-CSP) arrangement. The interconnect layer 713 in this example, comprises a flip-chip-substrate of the FC-CSP. In one or more examples the ground plane 709, of the waveguide-cavity 710, is arranged adjacent to the interconnect layer 713 and the launcher element 705 is spaced further from the interconnect layer 713 than the ground plane 709. The launcher element 705 is coupled to said connection 706 in the interconnect layer 713, by one or more vias 714 which may include the terminal 711 and that extend through the launcher-substrate 708 and through a slot 715 in at least one side wall 704 of the waveguide-cavity 710.

FIG. 7 further shows the launcher-substrate 708, in this and one or more other examples, having a substrate-cavity 718. The substrate-cavity 718 has a base 709, opposite the launcher element 705, and side walls 704. The substrate-cavity 718 defines the waveguide-cavity 710 wherein the ground plane 709 comprises a metallization layer at the base of the substrate-cavity in the launcher-substrate 708 and the side walls 704 comprise a further metallization layer over the side walls 704, of the substrate-cavity 718.

In one or more examples, the waveguide-cavity 710 is formed within the launcher-substrate 708 and comprises a void within the launcher-substrate 708, lined by the metallization of the ground plane 709 and the at least one sidewall 704.

The incorporation of voids/air cavities below the launcher element can allow for improved performance by improving the coupling of the radiated EM radiation to the waveguide.

In this and one or more examples, the launcher element 705 of the waveguide-cavity 710 is arranged spaced from the interconnect layer 713, and the ground plane 709, is arranged adjacent to the interconnect layer 713. Thus, the launcher element 705 is further from the interconnect layer 713 than the ground plane 709.

In one or more examples the launcher 703 is coupled to the flip-chip substrate 713 by solder-ball connections 711. In one or more examples the IC die 701 is coupled to the flip-chip substrate 713, by soldered connections 712.

In one or more examples the relative positions of the ground plane 709, and the launcher element 705, can be arranged to provide for the emission of EM radiation that is substantially directed away from the ground plane 709 and provide for reception of EM radiation that is substantially directed towards the ground plane 709 and is directed in either a substantially upward or a substantially downward direction as described previously.

In one or more examples the FC-CSP arrangement may be configured such that the vias 714 extend through an aperture formed in the ground plane 709, similar to the example of FIG. 3. Thus, the FC-CSP arrangement may be configured such that the vias 714 extend from the interconnect layer 713 at a location within a footprint 719 of the waveguide-cavity 710.

The launcher-substrate 708 may comprise a material which has low loss at frequencies of operation. The launcher-substrate 708 may be of a material that is a different material to the PCB 720, which may suffer from higher losses at these same frequencies. The launcher-substrate 708, and the launcher substrate of any other example, may be formed of laminated materials. The launcher-substrate 708 may be formed of at least one of PTFE (e.g. RO3003); a Bismaleimide-Triazine; a Borosilicate glass; or a fused Quartz material. It will be appreciated that other materials which provide a low loss at the frequencies of interest may also be used as suitable launcher-substrate 708 materials.

In one or more examples the launcher-substrate 708 may be of RO3003 material which has a low electric loss tangent of 0.0013 and the PCB 720 may be of FR4 material which has a high electric loss tangent of 0.018.

Figure 8:
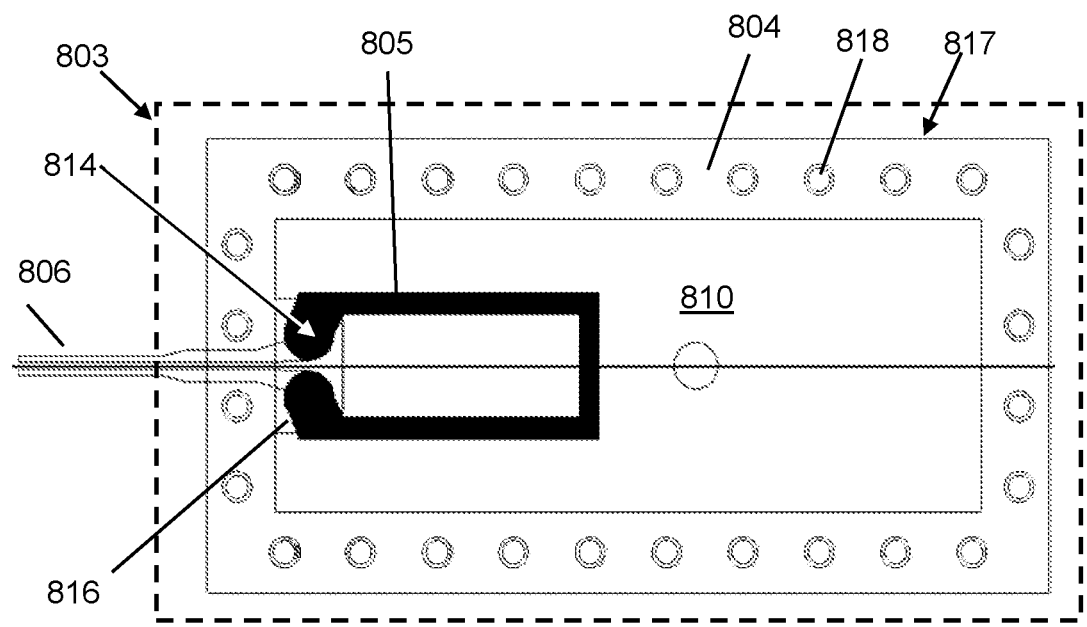
FIG. 8 shows a top view of an example launcher including a waveguide cavity including the launcher element and an aperture in the ground plane.

FIG. 8 shows a plan view of the launcher 803 including the waveguide-cavity 810. The launcher element 805 comprises a loop and said connection between the launcher 803 and the die comprising a differential microstrip line 806.

FIG. 8 also shows the aperture 816 (similar to the arrangement of FIG. 3), formed in the ground plane (not shown), through which the vias 814, couple the launcher element 805, to the interconnect layer.

Figure 9:
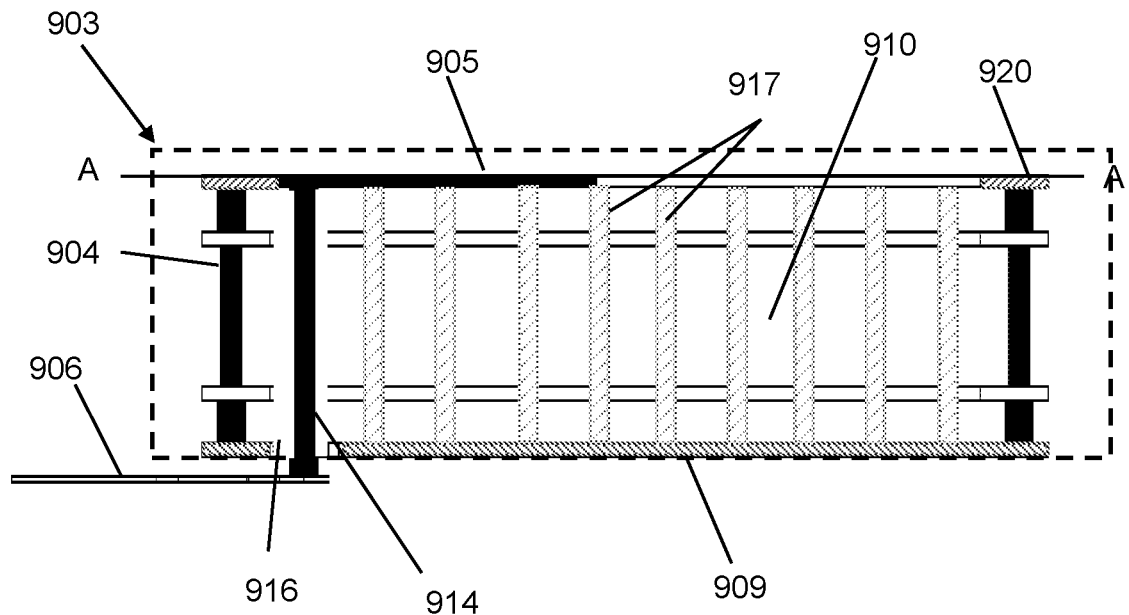
FIG. 9 shows a cross sectional side view of the waveguide-cavity indicating the ground plane and the side wall, as well as the connection between the launcher and the interconnect layer.

FIG. 9 shows a cross sectional view of the launcher 903 including the waveguide-cavity 910. The waveguide-cavity 910 comprising the ground plane 909 which may comprise a metallization layer in said launcher-substrate. The side walls may be provided by a plurality of vias 917, extending from, and electrically connected to, said ground plane 909 metallization layer. The plurality of vias 917 are arranged in a ring to form said at least one side wall 904, the said plurality of vias 917, at a point opposite their coupling to the metallization layer of the ground plane 909 are coupled together by a ring-shaped second metallization layer 920. In one or more examples, the ring-shaped second metallization layer 920, is in the first plane A-A with the launcher element 905.

The plurality of vias 917 thus comprise a plurality of spaced columns that form the at least one sidewall 904. It will be appreciated that the side walls may be formed by the plurality of columns of vias, as shown in FIGS. 8 and 9 or as a metallization of a wall of the side wall of the waveguide-cavity.

In any of the examples described herein, the waveguide cavity may have a plurality of different shapes.

In one or more examples, the at least one sidewall 904, comprises a single wall forming a substantially circular or substantially oval side wall. In one or more examples, the at least one sidewall 904 comprises at least three sidewalls 904 and may have a shape corresponding to any polygon cross section, such as square or rectangular.

In any of the examples described herein the launcher provides an interface to a waveguide, which is configured to be mounted to abut the package 100, 200, 300, 400, 500, 600, 700 or an interface layer between the waveguide and the package.

Figure 10:
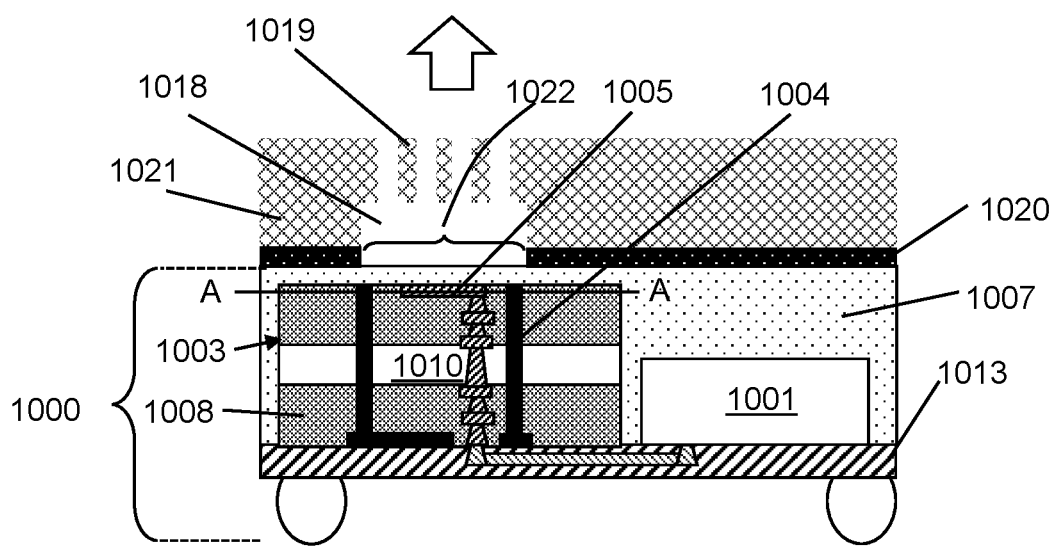
FIG. 10 shows a cross sectional side view of an example embodiment of a package wherein the package includes an electrically conductive interface layer for coupling to a waveguide.
Figure 11:
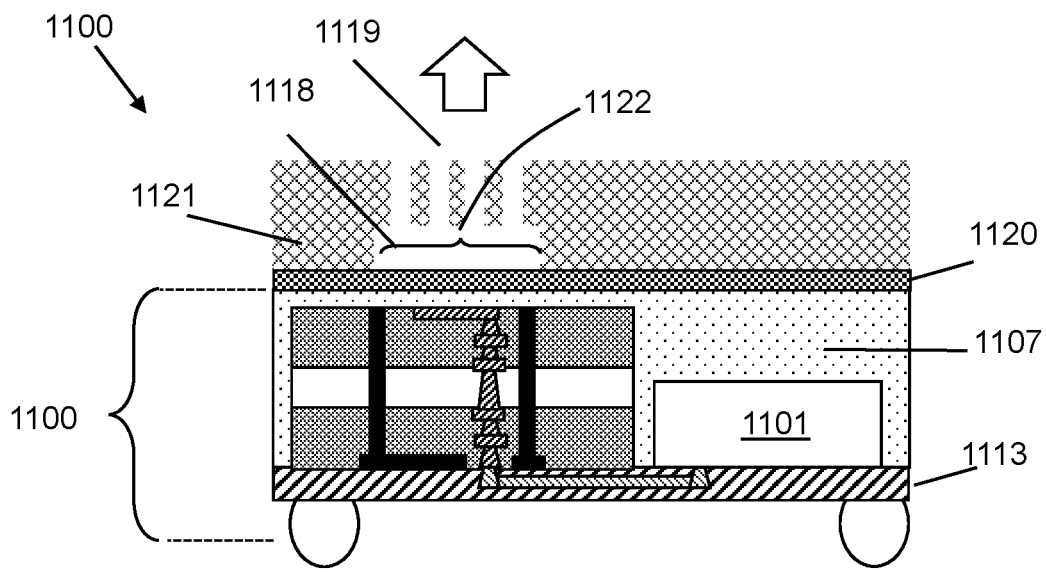
FIG. 11 shows a cross sectional side view of an example embodiment of a package wherein the package includes a dielectric interface layer for coupling to a waveguide.
Figure 12:
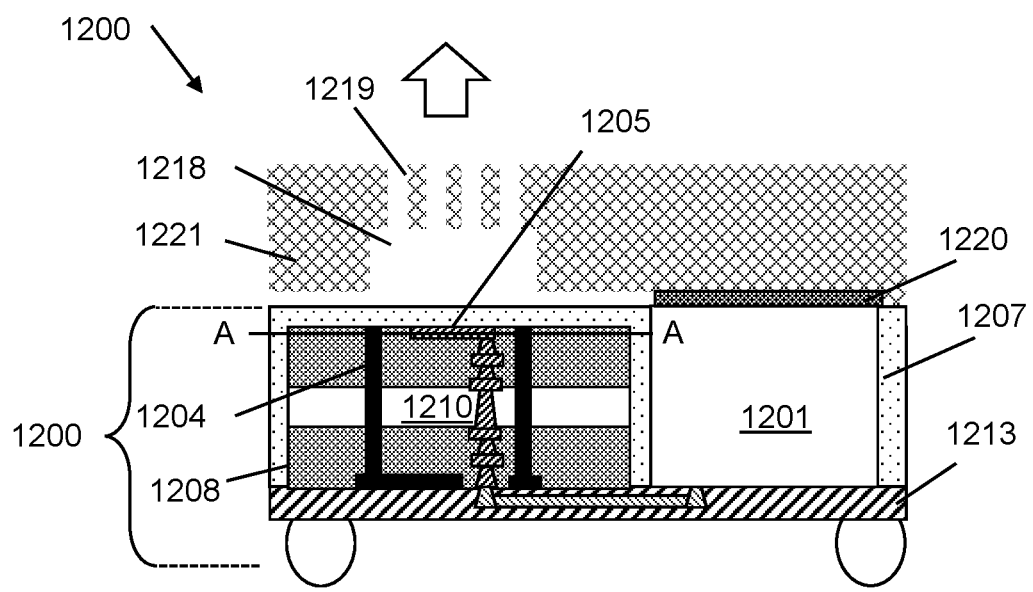
FIG. 12 shows a cross sectional side view of an example embodiment of a package wherein the package does not have an interface layer for coupling to a waveguide and the launcher-substrate is open to free space.

For example, when assembling the external waveguide to the package 100, 200, 300, 400, 500, 600, 700, an interface layer may be required to compensate for tolerances in manufacturing and positioning the package and the waveguide. FIGS. 10 to 12 show some possible arrangements for these interface layers 1020, 1120, 1220.

FIG. 10 shows the package 1000 of FIG. 3 coupled to a waveguide assembly 1021 comprising a waveguide 1018. An interface layer 1020 extends between the package 1000 and the waveguide assembly 1021. The waveguide 1018 includes an antenna array or a beam forming network 1019.

In this example the first plane A-A in which the launcher element 1005, is formed is located adjacent a side of the launcher-substrate 1008 and spaced apart from the interconnect layer 1013. Wherein, the side is covered with the mould material 1007 of the package 1000 and has an electrically conductive interface layer 1020, arranged in a ring on said mould material 1007. A hole 1022 in the ring is aligned with the waveguide-cavity 1010 and is configured to receive said waveguide 1018 thereover. The mould material 1007 forming the package 1000 on the side that is inward of a footprint of the side walls 1004, is left uncovered by said electrically conductive interface layer 1020 (and may form a border outside the side walls 1004).

FIG. 11 shows an equivalent launcher arrangement to that shown in FIG. 10 wherein the side of the launcher that emits EM radiation is covered with the mould material 1107 of the package 1100 and has a further dielectric material layer 1120 thereover and the waveguide assembly 1121 is configured to abut said dielectric material layer 1120.

FIG. 12 shows the package 1200 of FIG. 3 coupled to a waveguide assembly 1221. The IC die 1201 is covered by a thermal interface layer 1220 and the waveguide assembly 1221 is configured to abut said thermal interface layer 1220. The waveguide 1218 includes an antenna array or a beam forming network 1219.

In this example the first plane A-A in which the launcher element 1205 is formed is located adjacent a side of the launcher-substrate 1208 and spaced apart from the interconnect layer 1213. The side of the launcher that emits or receives EM radiation is covered with the mould material 1207 of the package 1200. In this example the waveguide assembly 1221 is spaced apart from the package 1207 by the thickness of said thermal interface layer 1220. In this example additional structures, such as locally periodic/quasi periodic pins or corrugations (not shown) may be added close to or around the waveguide opening to ensure effective EM coupling between the waveguide assembly and the waveguide cavity 1210.

In one or more examples the thermal interface layer 1220 can also be applied in combination with the conductive layer 1020 of FIG. 10 or the dielectric layer 1120 of FIG. 11. However, in that configuration the IC die 1001, 1101 would be exposed at the top surface of the package 1000, 1100 to enable thermal contact between the IC die and the thermal interface layer.

In one or more examples the waveguide assembly 1221 may be coupled to the waveguide-cavity 1210 by the use of additional structures, such as locally periodic/quasi period pins or corrugations (not shown). These periodic structures may be added close to, or around the waveguide opening to ensure effective EM coupling between the waveguide assembly and the waveguide cavity 1210.

In one or more examples, in addition to providing a low loss connection between the IC die 1201 and the waveguide antenna 1218, each launcher 103-803 of the plurality of launchers shall also provide a high isolation between adjacent launchers to avoid undesired coupling between each launcher.

In one or more examples the isolation of the adjacent launchers is achieved by the use of the interface layers 1020, 1120 and 1220 described in relation to FIG. 10, FIG. 11 and FIG. 12. In these examples the overall structure (which includes the package 1000, the launcher 1003 and the interface layer 1020) defines a stop-band which reduces the electromagnetic waves from propagating transversally (i.e. to reduce coupling between adjacent launchers).

In one or more examples the periodic structures may be aligned with the footprint of the side walls 1204. These periodic structures around the waveguide opening allow a stop-band for electromagnetic waves that propagate transversally between the package and the waveguide structure.

Figure 13:
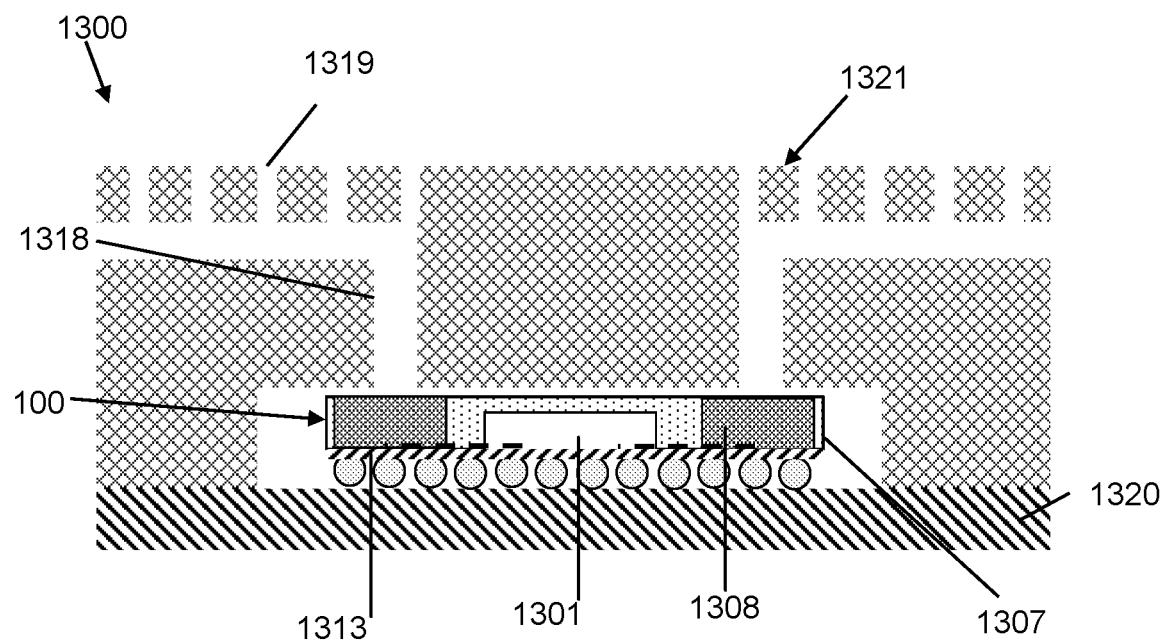
FIG. 13 shows a cross sectional side view of an example embodiment of a package coupled to a waveguide and antenna array.

FIG. 13 shows a combination of the package 100 of FIG. 3 coupled to a waveguide assembly 1321 comprising a waveguide 1318 and further coupled to a PCB 1320. The combination 1300 may be coupled to an antenna array 1319, via said waveguide 1318.

In one or more examples the antenna array 1319, may be configured to determine the polarization of the radiated and/or received EM radiation.

Figure 14:
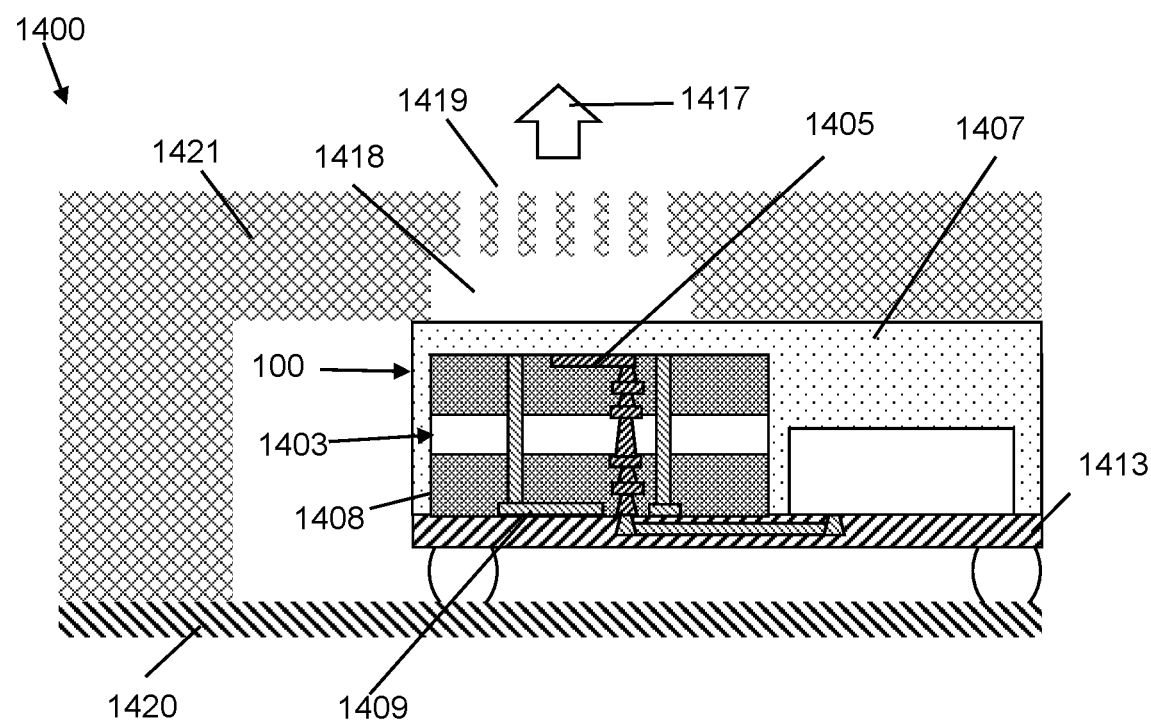
FIG. 14 shows a cross sectional side view of an example embodiment of a package coupled to a waveguide and antenna array for an upward directed emission and reception of electromagnetic radiation.
Figure 15:
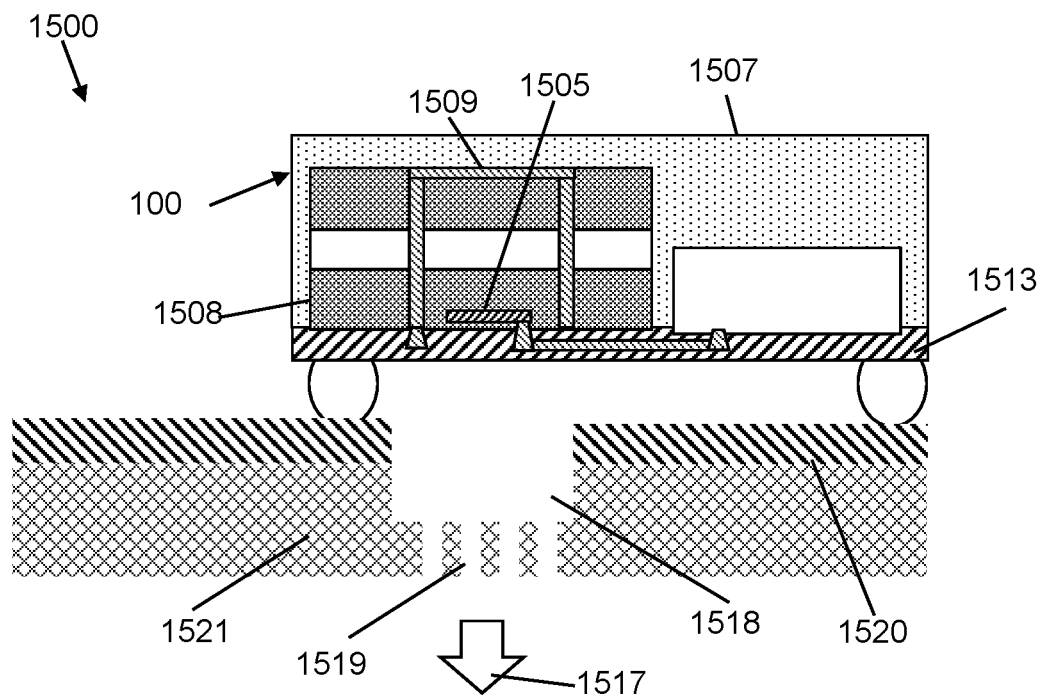
FIG. 15 shows a cross sectional side view of an example embodiment of a package coupled to a waveguide and antenna array for downward directed emission and reception of electromagnetic radiation.

FIGS. 14 and 15 show the package 100 of FIG. 3 in combination with a waveguide assembly 1421.

In one or more examples the relative positions of the ground plane 1409, 1509, and the launcher element 1405, 1505, can be arranged to provide for EM radiation that is substantially directed away from the ground plane 1409, 1509 and is directed in either a substantially upward 1417 or a substantially downward 1517 direction as described previously.

In one or more examples the waveguide 1418, 1518 has an entirely open cross section at the interface between the waveguide and the package 100. In one or more examples only a thin layer (e.g. less than 1 mm) of mould material 1407 is applied above the launcher 1403 which allows the launcher to effectively be coupled directly to the waveguide without any intermediate conductive or dielectric layers between the package 100 and the waveguide 1418.

In one or more examples, the mould material 107-1507, can be removed, or otherwise applied to form the package 107-1507 such as to expose the launcher element 105-1405 to free space. This can enable direct coupling of a waveguide 1018-1418 to the launcher substrate 108-1408 and improve the EM coupling between the launcher 103 and the waveguide 1418.

Figure 16:
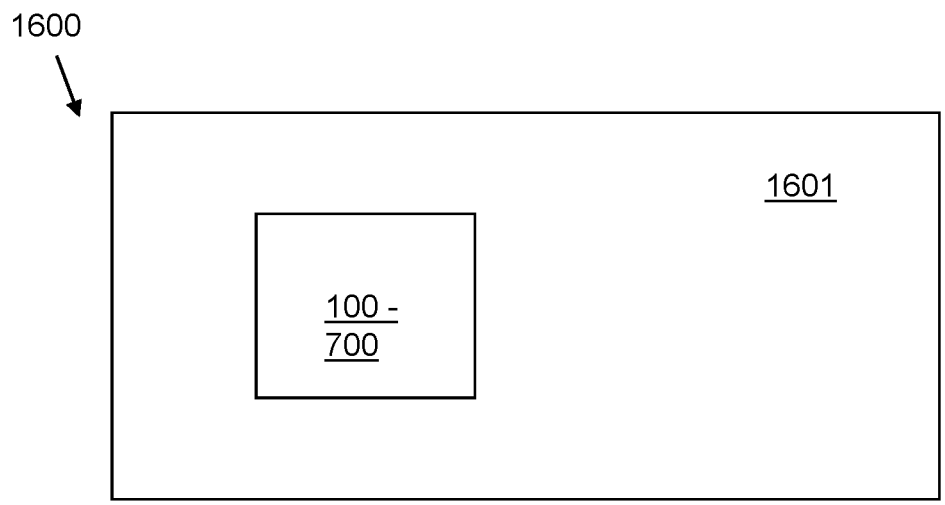
FIG. 16 shows an electronic device including package, wherein the electronic device may comprise a telecommunication radio interface or a radar system.

FIG. 16 shows an electronic device comprising, for example, one of a telecommunication radio interface and an (for example only, automotive) radar system, including the package 100-700.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:
1. A package comprising,
an integrated circuit, IC, die comprising circuitry configured to one or more of generate signalling for transmission to a waveguide and receive signalling from a waveguide, via a launcher, the die coupled to an interconnect layer extending out from a footprint of the die; and
the launcher is formed in a launcher-substrate, separate from the IC die, the launcher coupled to the IC die to pass said signalling therebetween by a connection in said interconnect layer, wherein said launcher comprises a launcher element mounted in a first plane within the launcher-substrate and a waveguide-cavity comprising a ground plane arranged opposed to and spaced from the first plane, the waveguide-cavity further defined by at least one side wall extending from the ground plane towards the first plane; and
wherein said die and said launcher are at least partially surrounded by mould material of said package.
2. The package of claim 1, wherein said package comprises one of:

a fan-out-wafer-level-package, FO-WLP, wherein said interconnect layer comprises a redistribution layer of said die; and a flip-chip-chip-scale-package, FC-CSP, wherein said interconnect layer comprises a flip-chip-substrate of said flip-chip-chip-scale-package.

3. The package of claim 1, wherein said ground plane of the waveguide-cavity is arranged adjacent to the interconnect layer and the launcher element is spaced further from the interconnect layer than the ground plane, wherein said launcher element is coupled to said connection in the interconnect layer by vias that extend through an aperture formed in said ground plane.

4. The package of claim 1, wherein said ground plane of the waveguide-cavity is arranged adjacent to the interconnect layer and the launcher element is spaced further from the interconnect layer than the ground plane, wherein said launcher element is coupled to said connection in the interconnect layer by vias that extend through the launcher-substrate and through a slot in the at least one side wall.

5. The package of claim 1, wherein said launcher element of the waveguide-cavity is arranged adjacent to the interconnect layer and the ground plane is spaced further from the interconnect layer than the launcher element, wherein said launcher element is coupled to said connection in the interconnect layer by one or more vias that extend through said launcher-substrate.

6. The package of claim 5 wherein the launcher element is connected to said one or more vias through a slot formed in said at least one side wall.

7. The package of claim 5, wherein the said one or more vias extend from the interconnect layer at a location within a footprint of the waveguide-cavity.

8. The package of claim 1, wherein said launcher element comprises a loop and said connection between the launcher and the die comprises a differential microstrip line.

9. The package of claim 1, wherein said waveguide-cavity comprises:

the ground plane of said waveguide-cavity comprising a metallization layer in said launcher-substrate, and a plurality of vias extending from, and electrically connected to, said ground plane metallization layer that are arranged in a ring to form said at least one side wall, the said plurality of vias, at a point opposite their coupling to the metallization layer, coupled together by a ring-shaped second metallization layer.

10. The package of claim 1, wherein said launcher-substrate includes a substrate-cavity having a base opposite the launcher element and side walls, the substrate-cavity defining the waveguide-cavity wherein the ground plane comprises a metallization layer at the base of the substrate-cavity in the launcher-substrate, and the side walls comprise a further metallization layer over the side walls of the cavity.

11. The package of claim 1, wherein the launcher-substrate comprises at least one of:

PTFE;

a Bismaleimide-Triazine;

a Borosilicate glass; and fused Quartz.

12. The package of claim 1, wherein the first plane in which the launcher element is formed is located adjacent a side of the launcher-substrate wherein, one of:

said side is covered with said mould material and has an electrically conductive interface layer arranged in a ring on said mould material that is aligned with said waveguide-cavity and is configured to receive said waveguide, wherein at least said mould material on said side that is inward of a footprint of said side walls is left uncovered by said electrically conductive interface layer; and said side is covered with mould material and has a further dielectric material layer and the waveguide is configured to abut said dielectric material layer; and said side of the substrate is uncovered and has periodic structures around the footprint of said side walls.

13. The package of claim 1, in combination with a waveguide, wherein the first plane in which the launcher element is formed is located adjacent a side of the launcher-substrate and said waveguide is arranged to couple to said side.

14. The package of claim 1, in combination with a waveguide, wherein the waveguide has an entirely open cross section at the interface between the waveguide and the package.

15. An electronic device comprising one of a telecommunication radio interface and a radar system, the electronic device comprising:

an integrated circuit, IC, die comprising circuitry configured to one or more of generate signalling for transmission to a waveguide and receive signalling from a waveguide, via a launcher, the die coupled to an interconnect layer extending out from a footprint of the die; and the launcher is formed in a launcher-substrate, separate from the IC die, the launcher coupled to the IC die to pass said signalling therebetween by a connection in said interconnect layer, wherein said launcher comprises a launcher element mounted in a first plane within the launcher-substrate and a waveguide-cavity comprising a ground plane arranged opposed to and spaced from the first plane, the waveguide-cavity further defined by at least one side wall extending from the ground plane towards the first plane; and wherein said die and said launcher are at least partially surrounded by mould material of said package.

16. The electronic device of claim 15, wherein said package comprises one of:

a fan-out-wafer-level-package, FO-WLP, wherein said interconnect layer comprises a redistribution layer of said die; and a flip-chip-chip-scale-package, FC-CSP, wherein said interconnect layer comprises a flip-chip-substrate of said flip-chip-chip-scale-package.

17. The electronic device of claim 15, wherein said ground plane of the waveguide-cavity is arranged adjacent to the interconnect layer and the launcher element is spaced further from the interconnect layer than the ground plane, wherein said launcher element is coupled to said connection in the interconnect layer by vias that extend through an aperture formed in said ground plane.

18. The electronic device of claim 15, wherein said ground plane of the waveguide-cavity is arranged adjacent to the interconnect layer and the launcher element is spaced further from the interconnect layer than the ground plane, wherein said launcher element is coupled to said connection in the interconnect layer by vias that extend through the launcher-substrate and through a slot in the at least one side wall.

19. The electronic device of claim 15, wherein said launcher element of the waveguide-cavity is arranged adjacent to the interconnect layer and the ground plane is spaced further from the interconnect layer than the launcher element, wherein said launcher element is coupled to said connection in the interconnect layer by one or more vias that extend through said launcher-substrate.

20. The electronic device of claim 15, wherein said launcher element comprises a loop and said connection between the launcher and the die comprises a differential microstrip line.

* * * * *